United States Patent
Baumgartner

(10) Patent No.: US 7,880,202 B2
(45) Date of Patent: Feb. 1, 2011

(54) MODULATED-VT TRANSISTOR

(75) Inventor: Peter Baumgartner, Munich (DE)

(73) Assignee: Infineon Technologies AG, Munich (DE)

( * ) Notice: Subject to any disclaimer, the term of this patent is extended or adjusted under 35 U.S.C. 154(b) by 343 days.

(21) Appl. No.: 11/604,650

(22) Filed: Nov. 27, 2006

(65) Prior Publication Data
US 2008/0122015 A1    May 29, 2008

(51) Int. Cl.
*H01L 29/76*    (2006.01)
*H01L 29/94*    (2006.01)

(52) U.S. Cl. .................. 257/286; 257/285; 257/287; 257/391; 257/392; 257/E21.404; 257/E21.409; 257/E21.633; 257/E29.003; 257/E29.053; 257/E29.054; 438/289; 438/275

(58) Field of Classification Search .............. 257/285, 257/286, 287, 391, 392, E21.404, E21.409, 257/E21.633, E29.003, E29.053, E29.054; 438/217, 289, 275
See application file for complete search history.

(56) References Cited

U.S. PATENT DOCUMENTS

| | | | | |
|---|---|---|---|---|
| 6,232,642 B1 * | 5/2001 | Yamazaki | ................ | 257/404 |
| 6,498,376 B1 * | 12/2002 | Miyagi et al. | ................ | 257/392 |
| 7,129,550 B2 * | 10/2006 | Fujiwara et al. | ............. | 257/401 |
| 7,339,235 B1 * | 3/2008 | Yamazaki et al. | ........... | 257/345 |
| 2002/0020873 A1 * | 2/2002 | Klodzinski | ................ | 257/328 |
| 2006/0273393 A1 * | 12/2006 | Chidambarrao et al. | ..... | 257/347 |

* cited by examiner

*Primary Examiner*—Dao H Nguyen
(74) *Attorney, Agent, or Firm*—Slater & Matsil, L.L.P.

(57) ABSTRACT

A semiconductor field effect transistor can be used with RF signals in an amplifier circuit. The transistor includes a source region and a drain region with a channel region interposed in between the source and drain regions. The transistor is structured such that the threshold voltage for current flow through the channel region varies at different points along the width direction, e.g., to give an improvement in the distortion characteristics of the transistor.

30 Claims, 3 Drawing Sheets

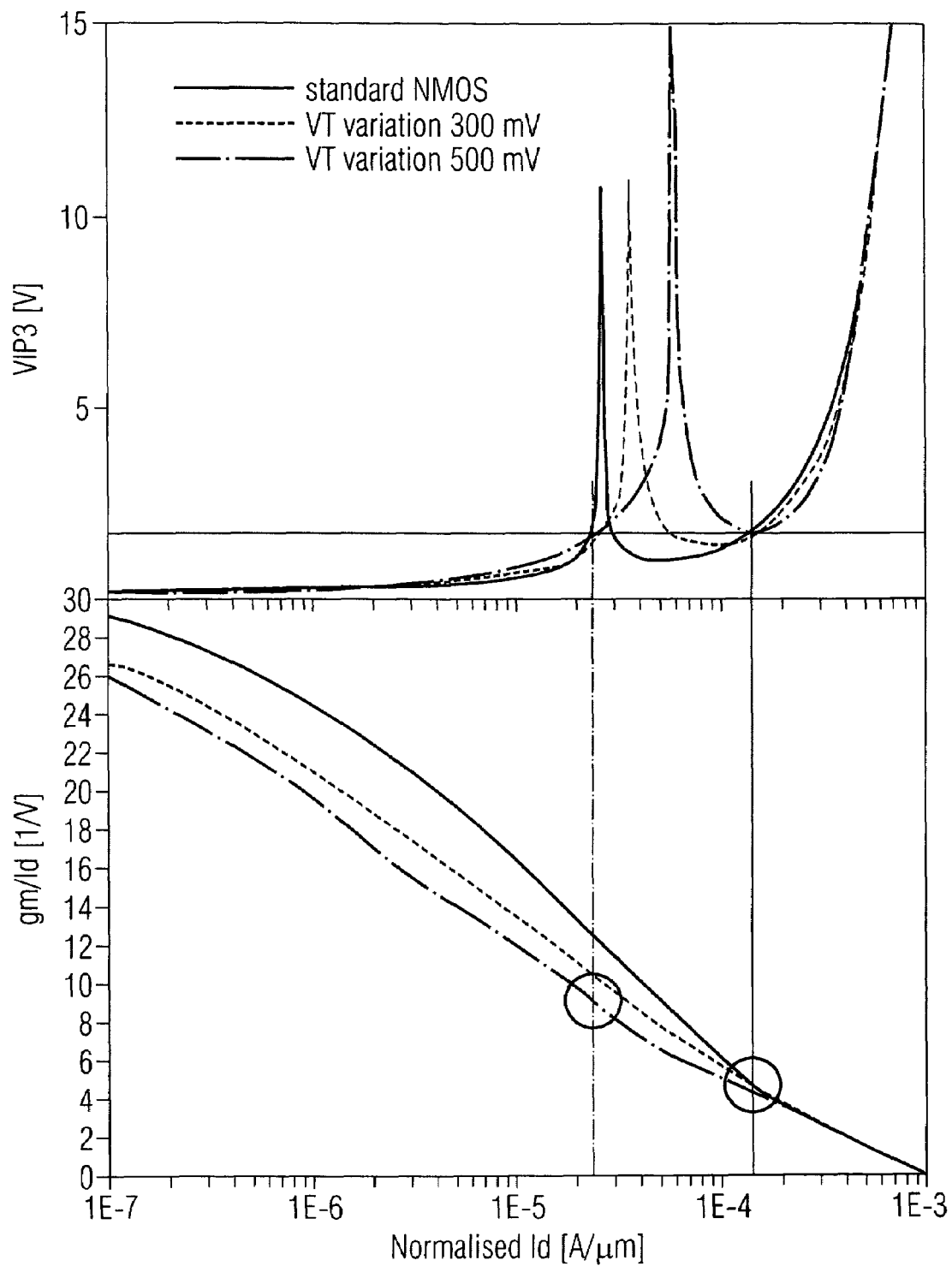

MODULATED-VT TRANSISTOR

TECHNICAL FIELD

This invention generally relates to the field of field effect transistors, and in particular to the design and fabrication of a field effect transistor that exhibits reduced harmonic distortion.

BACKGROUND

Field effect-type transistors have been used for many years in the field of amplifier circuitry, and provide a very useful device for integrated circuitry. The use of field effect transistors is widespread, as such, transistors show repeatable characteristics and useful and versatile amplifying properties.

Unfortunately, field effect transistors typically suffer from drawbacks when used within radio frequency (RF) amplifier circuits. In particular, the harmonic distortion caused in the signals being amplified at radio frequencies will tend to increase with the signal amplitude. This limits the dynamic range for which the field effect transistor can be used, and consequently limits the dynamic range of the amplifier circuitry.

In particular, the most critical source of the distortion is caused by the third harmonics of the signal. Such harmonics lie with frequencies that are quite near those of the frequencies associated with the actual signals themselves, and in light of this cannot be suppressed by simple filtering. Whilst it has been possible to improve the above harmonic distortion in prior art field effect transistors, this is at the expense of an increased power consumption. The most typical approach to improving the distortion characteristics, is by increasing the bias current which is used within the amplifying transistor. Clearly, this increase in bias current leads to the increase in power consumption, which brings with it low performance when many such amplifying circuits are provided, with additional problems associated with heat dissipation, and the like.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 shows two plots illustrating the normalized gain of the transistors modeled in FIG. 1 versus normalized current, as well as the figure of merit (VIP3) versus the normalized current.

DETAILED DESCRIPTION OF ILLUSTRATIVE EMBODIMENTS

As discussed above, the harmonic distortion of signals in an RF amplifier circuit, results from the third derivative of the transfer characteristics of the transistor. With the transistor transfer characteristics being given by $I_d/V_g$, the third derivative, $g^3$, is given by equation 1:

$$g^3 = \frac{\partial^3 I_d}{\partial V_g^3}$$

Herein, $I_d$ is the drain current of the transistor, and $V_g$ is the gate voltage applied to the gate of the transistor. In order, therefore, to influence the third derivative of the transistor transfer characteristics, that of equation 1, varying the gate voltage that needs to be applied for current flow through the transistor will vary the generated third harmonics.

In order for this to be effective within a single transistor, the present invention varies the threshold voltage of the transistor along the width of the channel of the transistor, preferably in a periodic manner. That is, the channel region lying between the source and drain regions of the transistor, is fabricated in such a manner that the threshold voltage $V_g$ varies at points taken along the width of the channel region of the device.

It is considered in embodiments of the present invention, to provide an improved semiconductor field effect transistor, which gives an improvement in the distortion characteristics when used with RF signals in an amplifier circuit, but without the necessity of increasing the bias current.

The field effect transistor as proposed comprises a source and drain region within the semiconductor, these regions having a channel region interposed therebetween. The channel region has a length, which defines the distance between the source and drain regions, and further a width, which defines the width of the opposed portion of the source and drain regions.

At the inner ends of the source and drain regions, respectively, so-called extensions may be formed, which are adjacent to the inner face of the respective source or drain region and which are doped with a lower dopant concentration than the source and drain regions and serve for connecting the transistor. Furthermore, a so-called halo doping may be provided in these regions, which halo doping is complementary to the standard doping and is being carried out by means of an oblique implantation. In the following, when using the term "extension" it is intended to be understood in a broad sense, covering a halo doping region as well, if present.

The field effect transistor is fabricated in such a manner that the threshold voltage for current flow through the channel region varies at different points along the width direction of the transistor. In so doing, the transistor shows an improvement in the distortion characteristics for RF signalling.

Figure 1:
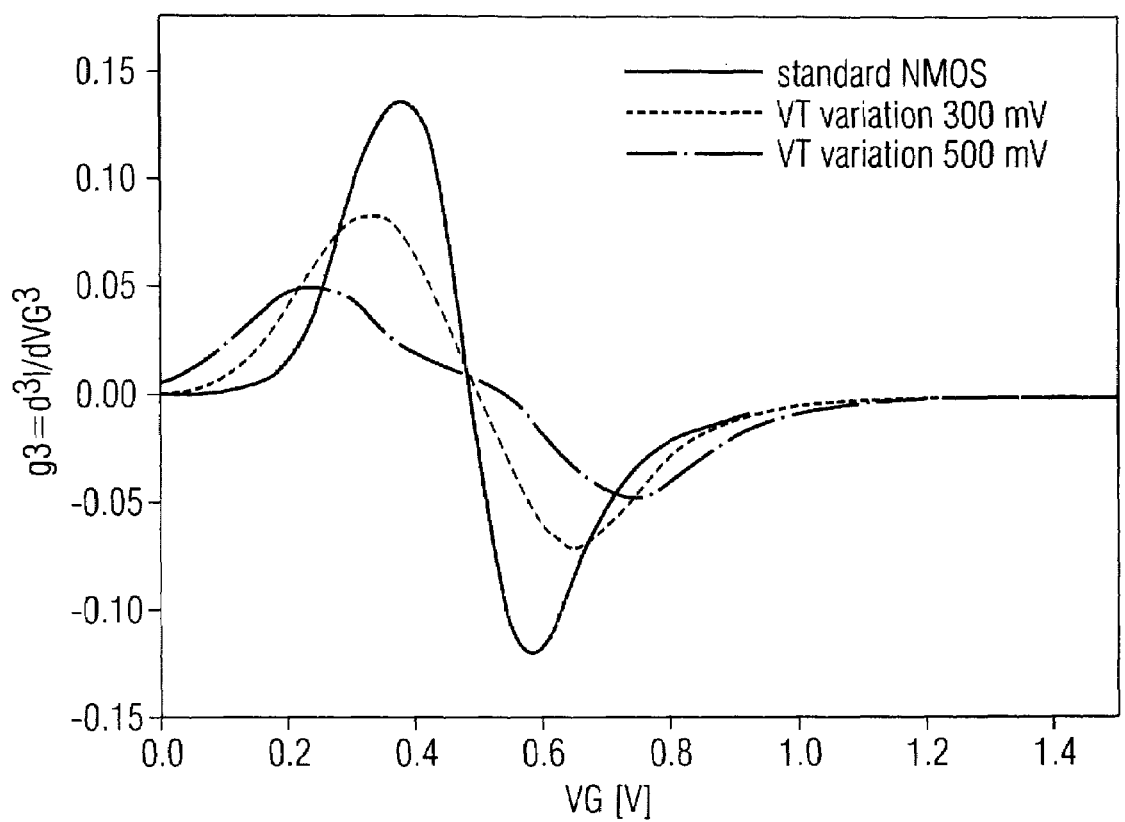
FIG. 1 is a plot showing simulation of the third derivative of the transistor transfer characteristic versus the applied gate voltage, for several devices.

A single transistor fabricated such that the threshold voltage varies along the width of the channel region, is essentially the same as a parallel connection of many transistors, each of which have a different threshold voltage. Looking at FIG. 1, simulated values of the third derivative of the transistor transfer characteristic $g^3$ are shown with varying applied gate voltages. In FIG. 1, the solid line refers to a standard n-type MOS field effect transistor, with the dot line and the dotted dash line showing two examples of transistors with varying threshold voltages according to embodiments of the present invention.

As is evident from FIG. 1, the two transistors according to embodiments of the present invention, those with a threshold voltage variation of 300 mV and 500 mV along the width of the channel region of the transistors, show a dramatic reduction in the third derivative of the transistor transfer characteristic. As the gate voltage is varied, each of the devices modeled goes through a maximum value back through the zero value at approximately 0.5 volts, and then through a minimum before stabilizing. By providing the threshold voltage variation according to embodiments of the present invention, it is clear that the specific values for the third derivative of the transfer characteristics are much reduced, up to a factor of approximately three for the threshold voltage variation of 500 mV, over the standard device. Clearly, reduction of the third derivative of the transistor transfer characteristics will lead to a great improvement in the harmonic distortion of signals in the RF device circuits.

Additional advantages of the devices according to embodiments of the present invention can be seen with consideration of the two graphs presented in FIG. 2. The lower graph shows the variation of the gain of the transistor divided by the applied drain current versus the normalized bias current: $I_d/W$, which is the bias drain current $I_d$, divided by the width W of the channel region of the device. Once again, the graph shows the modeled data for the three transistors as shown in FIG. 1. As can be seen from this graph, it is possible to operate the devices with smaller bias currents for lower power operation, and to generate the necessary gain with scaling of the width of the transistor.

The upper graph in FIG. 2 shows the figure of merit for harmonic distortion (according to Woerlee et at, RFCMOS Performance trends, proceedings of ESSDERC, pages 576-579,2000), versus the normalized drain bias current. As can be seen from this plot, the figure of merit VIP3 that is given by equation 2:

$$VIP3 = \sqrt{24 \cdot \frac{g_m}{g_3}}$$

progresses from a low value at low normalized bias currents, passes through a maximum, through a further low value and then increases once more. It is desirable to operate devices with a high VIP3 value, as this implies reduced harmonic distortion.

As can be seen from the upper plot of FIG. 2, the first maximum of the VIP3 value for the normal n-MOS device, has quite a narrow profile, and it is difficult to use a normal device in this region due to fabrication process variations tending to shift the graph. As such, standard n-MOS devices tend to be used with higher normalized drain currents, such that the improved VIP3 values can be obtained. This is shown in FIG. 2, wherein the standard n-MOS would be run at approximately 0.17 mA/μm to ensure a VIP3 value of approximately 1.7V. Whilst in theory it would be possible to operate the standard n-MOS device in the first maximum region, it is clear from the simulation that this would provide a very narrow range of normalized bias currents, essentially from 0.015 to 0.025 mV. As discussed above, this is impractical as process variations over a batch of circuits would tend to cause the precise position of the first maximum to shift slightly, and therefore the VIP3 value could not be precisely ensured.

Looking at the two further plots according to embodiments of the invention, it is clear that the first maximum peaks in each of the variable threshold voltage transistors broadens. This is of particular advantage, as it means that even with process variations during production, the effect on the location of the maximum of VIP3 values will not be significant, and therefore lower normalized bias currents can be used. This is shown in the upper plot of FIG. 2, wherein the VIP3 value of 1.7V could readily be met by a normalized bias current of 0.024 mA/μm for the proposed transistor with a threshold voltage variation of 500 mV, without concern regarding the width of this peak. Clearly, this leads to a significant reduction in the power consumption of the proposed devices.

Figure 3A:
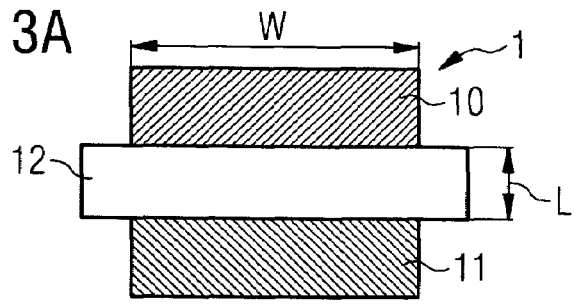
FIGS. 3A to 3E show several transistor designs according to embodiments of the present invention.
Figure 3B:
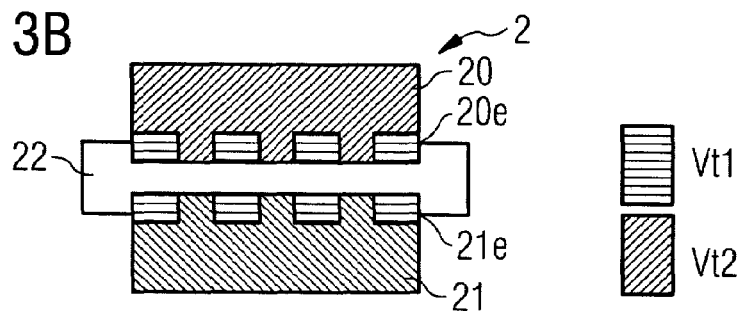
Figure 3C:
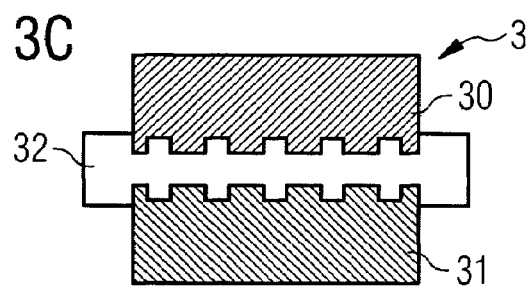
Figure 3D:
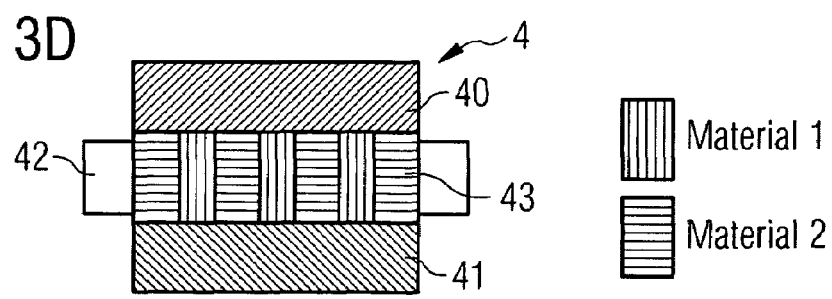

Numerous possibilities exist for varying the threshold voltage of the channel region of a transistor, several of which can be seen in FIGS. 3B to 3D.

Looking at FIG. 3A first, a simplified plan view or horizontal cross-sectional view, respectively, of a standard field effect transistor is shown. Herein, source 10 and drain 11 regions are shown separated by channel region 12. Source and drain extensions, as well as respective halo doping regions, may be present at the inner faces of the source 10 and/or drain 11 but are not shown in the schematic illustrations. The source 10 and drain 11 regions of the transistor 1 and, if present, the corresponding extensions and halo doping regions are formed using standard semiconductor processing technology. That is, the semiconductor substrate of a first semiconductor type is patterned using known methods, and the source 10 and the drain 11 regions are implanted with dopant materials at a high dose, to generate a semiconductor material of a second type.

As can be seen from FIG. 3A, the transistor 1 has a width W, which is defined by the opposed sections of the source 10 and drain 11 regions. In forming the source 10 and drain 11 regions, the channel region 12 is interposed therebetween. This channel region is typically comprised of the semiconductor substrate of a first semiconductor type, and the length L of the channel region 12 is the distance between the source 10 and drain 11 regions. Obviously, for a complete transistor, an insulating layer would be deposited above the channel region 12, upon which a gate electrode would further be patterned and deposited.

In operation, a bias voltage is placed between the source 10 and drain 11 regions, and a necessary voltage is placed on the gate electrode. With the required voltage in place on the gate electrode, the electrostatic repulsion effect will lead to channel inversion within the channel region 12, and formation of an inversion layer. This will then essentially switch the transistor on, in the manner known to those skilled in the art.

Looking at FIG. 3B, an embodiment of transistor device 2 according to the present invention is shown. As can be seen from this diagram, source 20 and drain 21 regions comprise extensions 20e, 21e formed of portions that exhibit different threshold voltages for current flow through channel regions 22. One possibility for amending the threshold voltages in this manner relates to the dopant materials that are implanted into the semiconductor substrate within the extensions. Changing the concentration of these dopant materials will change the number of available carriers in such regions, and therefore will change the threshold voltage for inversion layer formation through the channel region 22.

Clearly, changing the concentration or type of dopants will change the number of available carriers, and will lead to a change in the threshold voltage in such regions. Having regions of higher and lower dopant concentrations in the source 20 and drain 21 regions of the transistor 2, along the width direction of the transistor, will lead to a single transistor device that is essentially composed of many transistors in parallel. Such a device can most readily be fabricated, by selectively masking extension regions of the source 20 and drain 21 during the deposition of dopant materials. If the source 20 and drain 21 extensions are fabricated initially with a first concentration of dopant materials, sections adjacent to edges of the gate (previously deposited) can be masked in the known manner, and a further implantation of dopant materials can then be undertaken into the exposed regions. This will therefore lead to the structure as shown in FIG. 3B.

Another mechanism for generating the device shown in FIG. 3B, is to vary the dopant material in extensions 20e, 21e of the source 20 and drain 21. In the same manner as has been discussed above, fabrication of the extension regions 20e, 21e could be initially exposed to a first dopant material by selective patterning and implantation. After this step, the undoped regions could then be exposed to a separate dopant material, by selectively masking the already doped sections of the source 20 and drain 21. As shown above, this would lead to a device 2 in which the source 20 and drain 21 regions possessed different threshold voltages along points of the device 2 when viewed in the width direction.

As shown in FIG. 3B, and with regard to the two possible mechanisms discussed above, the dopant concentration or material can be changed in the width direction of the device 2. That is, the concentration of the dopant material in the first case discussed varies from higher to lower concentration and so forth in the width direction or in the second case the dopant material varies from one to another and so forth along the width direction of the device 2.

In a further embodiment, the variation in dopant concentration or material occurs in a stepwise manner. Stripes of higher and then lower concentration, or one dopant material followed by the next dopant material, make-up the source 20 and drain 21 regions. This would clearly be the result of the above discussed fabrication method, wherein sections of the source 20 and drain 21 regions are selectively masked during the deposition of dopant material.

Additionally, in the case where the concentration of dopant material is changed to give the differing threshold voltages through the channel region 22, the concentration could vary in a different manner from that of the striped pattern. Indeed, it could be possible to vary the concentration of the dopant materials in an approximately sinusoidal manner. That is, a variation in dopant which approximately sinusoidally changes from higher to lower values, along the width direction of the device 2.

Whilst in FIG. 3B, it would appear that regions of higher concentration and lower concentration are opposed to each other across the channel region 22, however, this is only one example. It is further possible, clearly for the regions of higher concentration in the source extension 20e, to oppose regions of lower concentration in the drain extension 21e. In doing so, it is possible to further tune the threshold voltage for the sections along the width direction of the device 2. Likewise, the implanted dopant material in the source 20 and drain 21 extensions 20e and 21e need not be the same on opposite sides of the channel region 22, and it is quite possible for the two dopant regions to be formed of different material.

Furthermore, in both the above cases, it is possible for some misalignment of the striped regions in the source 20 and drain 21 regions, so as to provide further values for the threshold voltage when viewed in the width direction of the device 2. Finally, it is not necessary for both the source 20 and drain 21 regions to be composed of the above described varying dopant concentration or material characteristics. Indeed, it is also possible for only one of the source 20 or drain 21 regions to be fabricated.

Looking at FIG. 3C, a further embodiment of the present invention is shown. In this embodiment, the length of channel region 32 varies as viewed along the width direction of the device 3 parallel to an edge of source 30 and drain 31. This can most readily be achieved by simply patterning the gate conductor serving as an implantation mask and thus defining the borderline of the channel region in such a manner. Obviously, by locally reducing the length of the channel region 32, the threshold voltage for current flow through the device 3 will vary. A reduced length, will lead to a changed threshold voltage, and vice versa.

It is possible for the length of the channel region 32 to vary in a stepwise manner in the width direction, i.e., regions of one length followed by sections of a second length. Additionally, it is possible, although more difficult to produce, for the length of the channel region 32 to vary in an approximately sinusoidal manner in the width direction of the device 3. Clearly, these two options are presented as examples only, and a person skilled in the art will be aware of further techniques and patterns which could be used for varying the length of the channel region 32. A device fabricated according to the above discussion, that of FIG. 3C, will clearly provide a single transistor device 3 which is apparently a parallel combination of many transistor devices with differing threshold voltages. As such, a device fabricated in this manner would show the desired/improved distortion characteristics.

A similar variation of dopant concentration and/or dopant material (ions used in implantation) as explained above for the source and drain extensions, may be produced across the channel region 22 of the transistor 2. Corresponding variations of the implanted ions and/or implantation dose and/or implantation energy should, as a matter of fact, be within the limits which are valid for the formation of the channel region but may, within these limits, have comparable effects as discussed above. Details of such process steps would be easily derivable for one of ordinary skill in the art, based on the above explanations on one hand and his knowledge of up-to-date MOSFET manufacturing processes.

FIG. 3D shows a plan view of a further embodiment according to the present invention. In this embodiment, an insulating layer 43 that lies above a channel region 42 and a gate electrode (not shown) is shown. In standard field effect transistor devices, the insulating layer between the channel region 42 and gate electrode is comprised of a single insulating material, typically an oxide or nitride layer, of approximately uniform thickness. In the present invention, as shown in FIG. 3D, the insulating layer 43 is comprised of plural, (i.e., 2, FIG. 3D) insulating materials.

When an additional layer is deposited on top of a semiconductor substrate, the mismatch in lattice constant between the atoms of the semiconductor substrate and the deposited insulating layer will lead to some change in the atomic arrangement in both layers. This rearrangement will introduce some mechanical strain into the semiconductor substrate.

The present embodiment, as shown in FIG. 3D, takes advantage of this difference in lattice constant and introduction of mechanical strain, in order to change the threshold voltage of the channel region 42 along the width direction of device 4. As is well known in the art, mechanical strain in semiconductor layers leads to different properties for charge flow through such regions. By patterning the insulating layer between the channel region 42 and gate electrode, e.g., composing it of a plurality of materials, it is possible to introduce regions of different mechanical strain in the semiconductor substrate in the channel region 42. Such regions of different mechanical strain will lead to different charge carrier transport characteristics, and therefore lead to varying threshold voltage characteristics. By providing a plurality of insulating layer 43 materials, the mechanical stress, and therefore threshold voltage characteristics, of the device 4 can be varied along the width direction of the device 4.

In the same manner as has been discussed above with relation to the embodiment shown in FIG. 3D, the material making up the insulating layer 43 can be varied in a periodic manner. This is most readily achieved by selectively patterning sections of the semiconductor substrate in the channel region 42, such that certain sections are open to deposition of an insulating layer 43 material of a first type, and in the same manner selectively depositing an insulating layer 43 material of a second type in the previously masked regions in a second step.

Clearly, an insulating layer 43 fabricated in the above manner will lead to portions of the channel region 42 having different mechanical strain, and therefore having different threshold voltages. Whilst only two materials are shown in the above example, this is not intended as a limitation, and numerous materials will be known to the person skilled in the art for performing the above method. Two of such materials are oxide and nitride, and the deposition of such materials are well known to those skilled in the art. Obviously, if more than two materials are used for forming the insulating layer 43 many regions of varying threshold voltage will be formed along points of the width of the device 4.

In all of the above examples, it is not necessary for the widths of the periodic variations leading to different threshold voltages to be the same. That is, whilst the FIGS. 3B, 3C and 3D appear to show equal width periodic variation in either the dopant concentration, dopant material, channel length and material making up the respective insulating layer, this is shown by way of example only. It is quite clear to the person skilled in the art, that the widths of these sections can differ along the width of the device.

A further embodiment, the geometrical appearance of which (in a plan view or horizontal cross-section) is identical or at least similar to FIG. 3D, may comprise a strip-shaped insulating layer (gate oxide between channel and gate conductor), wherein the thickness and composition and resulting dielectric constant of the insulating layer varies from strip to strip. The variation may, in particular, be an alteration of thicker and thinner portions and/or many comprise periodic alterations of the material composition.

As typically grown oxides that may be nitrided are used as material of the insulating layer, a suitable method to achieve such an alternating thickness and composition is to locally implant nitrogen into the semiconductor substrate, in advance of thermally growing the gate oxide. The nitrogen implantation results in a reduced gate oxide growth rate and in an increased nitrogen content of the respective portion, which results in a locally increased dielectric constant of the insulating layer. Both effects increase the capacitive coupling of the gate conductor to the channel and, therefore, result in a decreased threshold voltage and increased gain and current of the "local transistor", i.e., that portion of the transistor that includes the portion of the insulating layer with the increased dielectric constant.

On the other hand, the above-mentioned alteration of the thickness and composition of the insulating layer may be achieved by means of fluorine implantation, which results in locally increased thickness and reduced dielectric constant of the insulating layer above the fluorine doped surface portions. Furthermore, nitrogen and fluorine implantation may be applied in combination with each other, in a strip-shaped or similar manner, to enhance the periodic variations of the layer thickness and dielectric constant.

The above-mentioned local implantation of nitrogen and/or fluorine may be carried out on a masked substrate, to obtain the local restriction of the influence of the respective dopant. On the other hand, as for any of the variations of the material of the insulating layer mentioned further above, local variations may be obtained by a first process of non-selectively producing a homogeneous first material layer along the whole width of the channel, followed by a selective etching of predetermined portions thereof, using a mask, and replacing the etched-away first material with a second material, in a second thermal growth or deposition step, respectively.

Whilst numerous embodiments have been discussed above, in relation to varying the threshold voltage at points along the width of the device of the invention, these are not intended as being individual solutions. Indeed, it would be clear to the person skilled in the art that numerous of the above embodiments can be combined with each other to give a device with a varying threshold voltage at different points along the width of the device 1. In other words, it is possible to provide a device which is comprised of source and drain regions with different concentrations of dopant material and with varying lengths of the channel region. Further, it will be possible to combine the patterned insulating layer with any of the above devices, and so on.

Figure 3E:
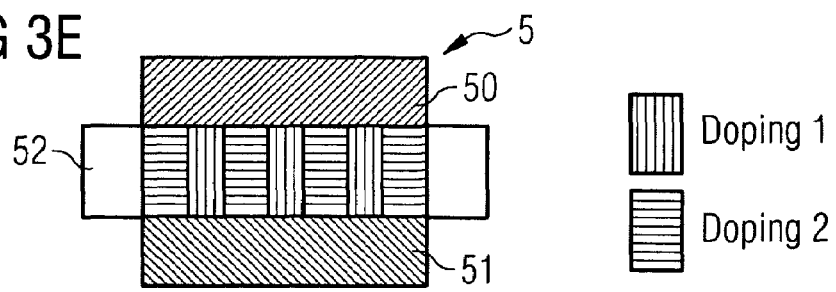

FIG. 3E shows a further embodiment of the invention, wherein a variation in width direction of a field effect device 5 comprising source 50 and drain 51 regions is achieved by means of a periodically alternating doping of a channel region 52, the channel region thus being subdivided into channel region portions (differently hatched) with remarkably different electrical properties. As mentioned further above, e.g., in connection with FIG. 3B, techniques for achieving such locally selective implantation, e.g., strip wise alternating, are well-known and readily available of carrying out this embodiment for the invention.

Such selective doping of the channel region, using different dopant materials and/or different dopant concentrations, may well be produced across the whole length of the semiconductor substrate of the transistor structure. After, in subsequent process steps, the gate electrode has been deposited over an insulation layer on the substrate surface and thereafter the source and drain regions have been formed by a further implantation step, using the gate electrode as a mask for self-aligning the source and drain regions, the influence of this originally varying doping profile is much less remarkable within the source and drain regions than in the channel region. This is due to the much higher final dopant concentration in the source and drain regions, compared to the channel region.

The above embodiments of the present invention are given by example only, and are not intended to limit the scope of the invention. Indeed, the scope of the invention is as detailed in the attached claims.

What is claimed is:

1. A field effect transistor comprising:
   a source region in a semiconductor body having a portion defining an inner edge of said source region;
   a drain region in the semiconductor body having a portion defining an inner edge of said drain region;
   a channel region in the semiconductor body interposed between the inner edge of the source region and the inner edge of the drain region, the channel region having a length defining a distance between the source region inner edge and the drain region inner edge and also having a width extending perpendicular to said length from a first edge to a second edge; and
   a multiplicity of extensions disposed at the inner edges of the source and drain regions, the multiplicity of extensions located within said channel width between said first edge and said second edge, said multiplicity of extensions affecting the transistor such that a threshold voltage for current flow through the channel region varies at different ones of said multiplicity of extensions along the width direction thereof, wherein the field effect transistor is a planar transistor.

2. The transistor according to claim 1, wherein the variation of the threshold voltage affects distortion characteristics, which are related to a third derivative of a transistor transfer characteristic, and are of a third harmonic of an RF frequency at which the transistor is operating.

3. The transistor according to claim 1, wherein the threshold voltage for current flow through the channel region varies in an approximately sinusoidal manner in the width direction.

4. The transistor according to claim 1, wherein the threshold voltage for current flow through the channel region varies in a stepwise manner in the width direction.

5. The transistor according to claim 1, further comprising dopant material implanted within said multiplicity of extensions of at least one of the source and drain regions; and
   wherein the threshold voltage for current flow through the channel region is varied by varying, in the width direction, the concentration of the dopant material implanted in said multiplicity of extensions of said at least one of the source and drain regions.

6. The transistor according to claim 5, wherein the concentration of the dopant material implanted in the multiplicity of extensions of at least one of the source region and drain region varies in a periodic manner along the width direction of the channel region.

7. The transistor according to claim 6, wherein the concentration of the dopant material varies in a stepwise manner in the width direction.

8. The transistor according to claim 1, wherein the multiplicity of extensions to the source and drain regions comprise a plurality of different dopant materials having different electrical properties with respect to each other such that the semiconductor body has different conductivity regions doped with different materials; and
wherein the threshold voltage for current flow through the channel region is varied by varying, in the width direction, the dopant materials implanted in either or both of the source and drain extensions, such that one or both of the source and drain extensions have varying conductivity in the width direction.

9. The transistor according to claim 1, wherein the multiplicity of extensions vary the threshold voltage for current flow through the channel region by varying the length of the channel region along the width direction.

10. The transistor according to claim 1, wherein the variation of the threshold voltage is to give an improvement in distortion characteristics, the distortion characteristics being related to a third derivative of a transistor transfer characteristic, and are of a third harmonic of an RF frequency at which the transistor is operating.

11. A method for fabricating a field effect transistor the method comprising:
selectively forming regions of dopant material within a semiconductor of a first type to form source and drain regions of the transistor of a second semiconductor type, each of said source and drain regions defining an inner edge and at least one of said source and drain regions further forming a multiplicity of extensions at its inner edge, the inner edge of said source region and the inner edge of the drain region defining a channel region interposed between the inner edges, the channel region having a length defining a distance between the inner edges of the source and drain regions and also having a width extending perpendicular to said length from a first edge to a second edge; and
said multiplicity of extensions of said at least one of said source and drain regions located within the channel width so as to form structural differences between said first edge and said second edge that define a channel region which has a threshold voltage for current flow which varies at different ones of said multiplicity of extensions along the width direction of the channel, wherein the field effect transistor is a single gate transistor.

12. The method according to claim 11, wherein forming said structural differences further comprises implanting the dopant material in the multiplicity of extensions of the at least one of the source and drain regions and wherein the concentration of the dopant material implanted in the extensions of said at least one of the source and drain regions is varied in the width direction in order to vary the threshold voltage for current flow through the channel region at said multiplicity of extensions along the width direction of the channel.

13. The method according to claim 12, wherein forming the structure differences in the multiplicity of extensions of the at least one of the source and drain regions comprises forming a plurality of different dopant materials in either or both of the source and drain extensions exhibiting different electrical characteristics with respect to each other, and
wherein the different dopant materials are implanted in either or both of the source and drain extensions along the width direction of the channel, such that one or both of the source and drain extensions have varying electrical properties in the width direction such that the current flows into the channel region with different transport characteristics.

14. The method according to claim 12, wherein the implantation of dopant material implanted in the multiplicity of extensions in said at least one of the source and drain extensions is undertaken so as to vary the length of the defined channel along the width direction of the transistor, in order to vary the threshold voltage for current flow through the channel region at different points along the width direction of the channel.

15. A field effect transistor comprising:
a source region disposed in a top surface of a substrate;
a first source extension region disposed adjacent the source region in the top surface;
a second source extension region disposed adjacent the source region in the top surface, the first and the second source extension regions sharing a common boundary;
a drain region disposed in the top surface of the substrate;
a first drain extension region disposed adjacent the drain region in the top surface;
a second drain extension region disposed adjacent the drain region in the top surface, the first and the second drain extension regions sharing a common boundary; and
a channel region disposed in the top surface of the substrate, a first portion of the channel region being disposed between the first source and drain extension regions, a second portion of the channel region being disposed between the second source and drain extension regions, the first and the second portions of the channel region sharing a common boundary.

16. The transistor of claim 15, wherein the first source extension region and the second source extension region have different dopant concentrations and/or dopant material.

17. The transistor of claim 15, wherein the first drain extension region and the second drain extension region have different dopant concentrations and/or dopant material.

18. The transistor of claim 17, wherein the first drain extension region and the second drain extension region have different dopant concentrations.

19. The transistor of claim 15, further comprising a gate disposed over the channel region.

20. The transistor of claim 15, further comprising:
a third source extension region disposed adjacent the source region in the top surface, the second and the third source extension regions sharing a common boundary; and
a third drain extension region disposed adjacent the drain region in the top surface, the second and the third drain extension regions sharing a common boundary; and
a third portion of the channel region disposed between the third source extension region and the third drain extension region, the second and the third portions sharing a common boundary.

21. The transistor of claim 20, wherein the second source extension region and the third source extension region have different dopant concentrations and/or dopant material.

22. The transistor of claim 20, wherein a doping concentration along a line from the first source extension region to the third source extension region through the second source extension region follows a sinusoidal path.

23. The transistor of claim 20, wherein a threshold voltage for current flow through the first portion of the channel region is different from a threshold voltage for current flow through the second portion of the channel region, and wherein the threshold voltage for current flow through the first portion of the channel region is about the same from a threshold voltage for current flow through the third portion of the channel region.

24. The transistor of claim 15, wherein a threshold voltage for current flow through the first portion of the channel region is different from a threshold voltage for current flow through the second portion of the channel region.

25. A planar field effect transistor comprising:

a source region disposed in a top surface of a substrate;

a first source extension region disposed adjacent the source region in the top surface;

a second source extension region disposed adjacent the source region in the top surface, the first and the second source extension regions sharing a common boundary, wherein the first source extension region and the second source extension region have different dopant concentrations; and a third source extension region disposed adjacent the source region in the top surface, the second and the third source extension regions sharing a common boundary, wherein the second source extension region and the third source extension region have different dopant concentrations.

26. The transistor of claim 25, further comprising:

a drain region disposed in the top surface of the substrate;

a first drain extension region disposed adjacent the drain region in the top surface;

a second drain extension region disposed adjacent the drain region in the top surface, the first and the second drain extension regions sharing a common boundary; and a third drain extension region disposed adjacent the drain region in the top surface, the second and the third drain extension regions sharing a common boundary.

27. The transistor of claim 26, further comprising a channel region disposed in the top surface of the substrate, the channel region comprising:

a first portion of the channel region being disposed between the first source and drain extension regions;

a second portion of the channel region being disposed between the second source and drain extension regions, the first and the second portions sharing a common boundary; and a third portion of the channel region disposed between the third source extension region and the third drain extension region, the second and the third portions sharing a common boundary.

28. The transistor of claim 27, further comprising a gate disposed over the channel region.

29. The transistor of claim 27, wherein a doping concentration along a line from the first source extension region to the third source extension region through the second source extension region follows a sinusoidal path.

30. The transistor of claim 27, wherein a threshold voltage for current flow through the first portion of the channel region is different from a threshold voltage for current flow through the second portion of the channel region, and wherein the threshold voltage for current flow through the first portion of the channel region is about the same from a threshold voltage for current flow through the third portion of the channel region.

* * * * *